United States Patent [19]

Mito et al.

[11] 4,425,650
[45] Jan. 10, 1984

[54] BURIED HETEROSTRUCTURE LASER DIODE

[75] Inventors: Ikuo Mito; Mitsuhiro Kitamura; Kazuhisa Kaede; Kohroh Kobayashi, all of Tokyo, Japan

[73] Assignee: Nippon Electric Co., Ltd., Tokyo, Japan

[21] Appl. No.: 252,773

[22] Filed: Apr. 10, 1981

[30] Foreign Application Priority Data

Apr. 15, 1980 [JP] Japan .................................. 55-48665
May 12, 1980 [JP] Japan .................................. 55-61671
Sep. 5, 1980 [JP] Japan .................................. 55-123261

[51] Int. Cl.$^3$ .............................................. H01S 3/19
[52] U.S. Cl. ..................................... 372/46; 357/17; 372/50
[58] Field of Search ................ 372/44, 45, 46, 50; 357/17

[56] References Cited

U.S. PATENT DOCUMENTS 4,230,997  10/1980  Hartman et al. ..................... 372/46

OTHER PUBLICATIONS

Hirao et al., "Fabrication and Characterization of Narrow Stripe InGaAsP/InP Buried Heterostructure Lasers", *Journal of Applied Physics,* vol. 51, No. 8, Aug. 1980, pp. 4539-4540.

*Primary Examiner*—James W. Davie
*Attorney, Agent, or Firm*—Sughrue, Mion, Zinn, Macpeak and Seas

[57] ABSTRACT

A buried heterostructure laser diode and method for making the same wherein an active layer is provided in a semiconductor region forming a mesa stripe, and, except for the top surface portion of the mesa stripe, the side surface portion of the mesa stripe and the remainder are covered by a current-blocking layer. Furthermore, a current-confining layer covers only this current-blocking layer, and a clad layer covers the current-blocking layer and the top surface portion of the mesa stripe.

7 Claims, 28 Drawing Figures

BURIED HETEROSTRUCTURE LASER DIODE

The present invention relates to a buried heterostructure semiconductor laser diode, and more particularly to a structure of a buried heterostructure laser diode made of InGaAsP crystal layers on an InP substrate and a method for producing the same.

Because of the remarkable progress in the developments of optical fibers, light sources, optical receivers and various optical circuit components, an optical fiber communication system is rapidly coming into the stage of practical utilization. In a single mode optical fiber (SMF) of a silica glass system, the transmission loss in the 1.3 μm band and 1.5 μm band of optical wavelengths is an extremely low value, about 0.5 dB/km. In addition, an emitting wavelength range of about 1.1~1.7 μm can be obtained by a laser diode (LD) employing a mixed crystal of $In_{1-x}Ga_xAs_{1-y}P_y/InP$ series ($0 < x, y < 1$) as its material. With a combination of these SMF and LD, it has become possible to realize a long-distance large-capacity optical fiber transmission system which can directly transmit a single over 50 km or more.

A laser diode has characteristic merits for use as a light source in an optical fiber transmission system such as being small in size, highly efficient and capable of being directly modulated. However, such a light source, to be practical and, taking into consideration the coupling between a light source and an optical fiber, is required to have excellent performance characteristics such as a low lasing threshold current, fundamental transverse mode lasing at a high optical output, operability at a high temperature, and so on. In order to fulfil these requirements, laser diodes having various structures have been proposed and fabricated. Especially, a buried heterostructure laser diode (abbreviated as BHLD) is known to have such good characteristics for a light source in an optical fiber communication system as a low lasing threshold current, high temperature operation and an isotropic emitted beam, because it has a structure adapted to perfectly confine both carriers and light within an active layer.

As one of these BHLD's, a device employing a mixed crystal material of an InGaAsP system whose lasing wavelengths are in the range of 1.1-1.7 μm which covers almost the entire low-loss wavelength region of a silica glass optical fiber, and a method for fabricating the same are disclosed in an article entitled "Fabrication and characterization of narrow stripe InGaAsP/InP buried heterostructure lasers" by M. Hirao et al in *Journal of Applied Physics*, Vol. 51, No. 8, pages 4539 & 4540, August 1980. This BHLD presents excellent performance characteristics such as a lasing wavelength of 1.3 μm, a lasing threshold current as small as 20 mA, and operability up to a temperature of about 80° C.

However, in a BHLD generally higher harmonic transverse modes are liable to be excited because the difference in refractive index between the embedded active layer and the surrounding buffer layer and clad layer is large. In order to suppress the generation of these higher harmonic transverse modes, it is necessary to reduce the stripe width of the active layer to 1 1 2 μm and thereby cut off the higher harmonic transverse modes. Although M. Hirao et al fabricated an InGaAsP-BHLD having an active layer width of 1-2 μm through a special reverse mesa etching treatment, in the case where the active layer is located as deep as several microns or more from the etching surface, it is extremely difficult both to precisely determine the stripe width of the active layer which also serves as an optical waveguide, and also to improve the linearity of the active layer stripe for the purpose of reducing optical waveguide loss.

In addition, as will be described later, since the temperature characteristic of the lasing threshold current of an InGaAsP system laser diode is poor as compared to that of an AlGaAs system laser diode, the InGaAsP-BHLD is improved in its temperature characteristic by introducing a p-type InP current blocking layer. This p-type InP current blocking layer must be epitaxially grown so that the surface of the blocking layer may approximately align with the active layer upon embedding growth. However, since this growth is special epitaxial deposition on a side surface portion of a mesa configuration, control of the grown film thickness is difficult.

As described above, while the BHLD in the prior art was a light source suited for an optical fiber communication system, difficulty in fabrication thereof was its shortcoming.

It is one object of the present invention to provide a BHLD having an improved linearity of the active layer stripe and a reduced optical waveguide loss.

Another object of the present invention is to provide a BHLD having such structure that a current blocking layer can be easily formed in a reproducible and reliable manner.

Still another object of the present invention is to provide a BHLD having a flat top surface, and which can be easily assembled as a device.

Yet another object of the present invention is to provide a plurality of BHLD's having different lasing wavelengths formed on the same substrate.

A still further object of the present invention is to provide a method for producing a BHLD which can achieve the above-mentioned objects.

According to the present invention, a novel BHLD has such structure that an active layer is provided in a semiconductor region forming a mesa stripe, and except for the top surface portion of the mesa stripe the side surface portion of the mesa stripe and the remainder are covered by a current blocking layer. Furthermore, a current confining layer covers only this current blocking layer, and a clad layer covers this current blocking layer and the top surface portion of the mesa stripe.

A method for producing a BHLD having the above-described structure includes principally the process of uniformly growing a necessary layer or layers and an active layer on a substrate, then forming a mesa stripe including the active layer so as to have a predetermined stripe width, thereafter selectively growing a current blocking layer and a current confining layer successively on the mesa-shaped structure except for the top surface of the mesa stripe, and subsequently growing a clad layer on the top surface of the mesa stripe and on the current confining layer.

For the selective growth of the current blocking layer and the current confining layer, two alternative methods can be employed. One of the methods is to provide a growth precluding mask on the top surface of the mesa stripe. The other method, which is more preferable than the first method, is carried out, without making use of a mask, by adjusting the width and height of the mesa stripe at values enabling the selective growth. In this second method, the width of the stripe can be selected in the range of 0.1 to 4 μm while the height of the stripe is selected in the range of 0.5 to 5 μm.

The above-mentioned and other features and objects of the present invention will become more apparent by reference to the following description of preferred embodiments of the invention taken in conjunction with the accompanying drawings, wherein.

Figure 1:
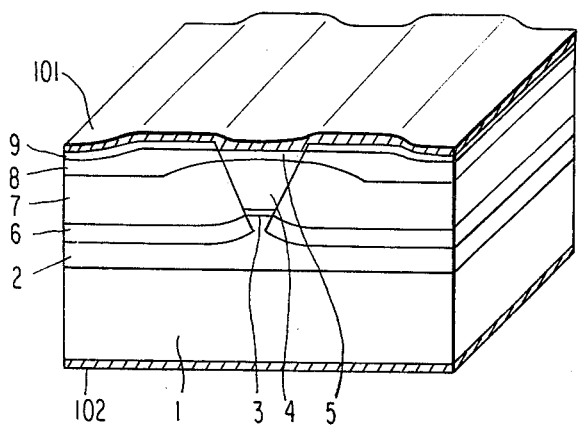
FIG. 1 is a perspective view showing one example of BHLD's in the prior art.

Referring now to FIG. 1 of the drawings, the BHLD proposed by M. Hirao et al is made by successively growing, on an n-InP substrate 1, an n-InP buffer layer 2, a non-doped InGaAsP active layer 3, p-InP clad layer 4 and a p-InGaAsP cap layer 5, applying a stripe-shaped SiO$_2$ mask to the top layer 5, and etching the layers into a reverse mesa shape down to the middle of the buffer layer 2. Thereafter, a p-InP current blocking layer 6, an n-InP current confining layer 7 and an n-InGaAsP layer 8 are successively grown thereon. Subsequently, a positive electrode 101 is provided via a SiO$_2$ film 9 having a stripe window, and a negative electrode 102 is provided on the other surface on the side of the substrate 1.

It is to be noted that as a matter of course, the active layer 3 made of InGaAsP has a smaller band gap and larger refractive index than the surrounding layers made of InP, such as the buffer layer 2, clad layer 4, current blocking layer 6 and current confining layer 7.

As briefly mentioned previously, a laser diode of an InGaAsP system has the shortcoming that generally the temperature-dependency of the lasing current threshold value thereof is large as compared to that of a laser diode of an AlGaAs system. The lasing current threshold value $I_{th}$ in the proximity of the room temperature can be generally approximated by the following equation:

$$I_{th}(T) = I_o \exp (T/T_o).$$

As compared to the characteristic temperature $T_o$ of about 150 K in the case of the AlGaAs system, the characteristic temperature $T_o$ in the case of the InGaAsP system is as low as about 60–70 K, and hence the temperature dependency of the threshold value is large. Furthermore, in the case of the InGaAsP-BHLD, the leakage current flowing through a pn-junction of InP in the periphery of the active layer increases at about 40° C. or higher. When the p-InP current blocking layer 6 is omitted from the structure shown in FIG. 1, the characteristic temperature $T_o$ would deteriorate to 40–50 K. Accordingly, in order to prevent deterioration of the characteristic temperature of the InGaAsP-BHLD, it is necessary to prevent conduction between the current confining layer 7 and the n-InP clad layer 2 in FIG. 2, and to that end, the p-InP current blocking layer 6 extends to the side surfaces of the active layer 3. By making such provision, the characteristic temperature $T_o$ can be suppressed to about 70 K up to the device temperature of about 100° C. Here, in order to make the p-InP current blocking layer 6 continues to the side surface of the InGaAsP active layer 3 in the fabrication process of the BHLD shown in FIG. 1, it is necessary to precisely control both the etching depth when etching the mesa shape and also the thickness of the p-InP current blocking layer 6. However, the currently employed procedures, such as liquid-phase epitaxial growth and mesa etching making use of a bromine (Br)-ethanol solution, do not have a sufficient controllability to achieve the desired precision. Accordingly, the yield of fabrication of the InGaAsP-BHLD shown in FIG. 1 has been low.

Before explaining the present invention, brief description will be made of the materials of a BHLD. In the case of the materials of an InGaAsP system, In, Ga, As and P are all hardly oxidized. This is quite in contrast to the material of an AlGaAs system where Al is liable to be oxidized. In an InGaAsP system, therefore, poor "wetting" of a surface due to oxide or an oxide film would scarcely occur in an epitaxial regrowth. Embedding growth, selective epitaxial growth or the like can be achieved relatively easily, and so, in the fabrication of a BHLD, the embedding epitaxial regrowth process is now not a factor in degrading the yield of fabrication. At first, description will be made of a preferred embodiment of the present invention in which the BHLD according to the present invention is realized through a fabrication process employing embedding growth twice, with reference to FIG. 2 and FIGS. 3A to 3D.

Now a basic structure of a BHLD according to the present invention will be described briefly with reference to FIG. 2. A current blocking layer 16 is provided on a buffer layer 12 forming a mesa stripe 121, including an active layer 13 except it is not provided on the top surface portion of the mesa stripe 121, and a current confining layer 17 is provided only on the blocking layer 16. Then, a clad layer 14 is provided on the top surface of both the mesa stripe 121 and the confining layer 17, and thereby a basic structure of a BHLD in which deterioration of temperature-characteristics is prevented, can be obtained.

Figure 2:
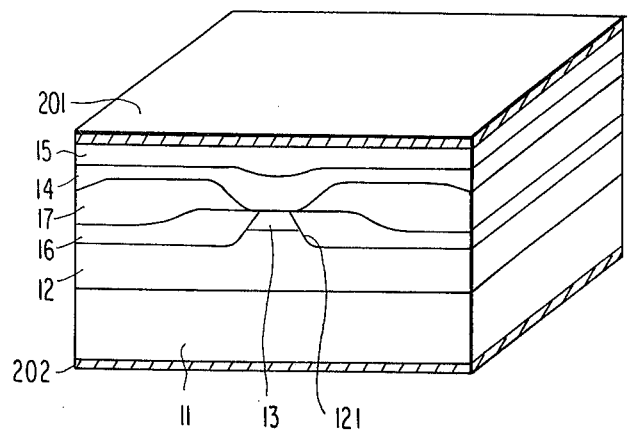
FIG. 2 is a perspective view of a BHLD according to a first preferred embodiment of the present invention.

One preferred embodiment of the BHLD according to the present invention as shown in FIG. 2 will be described in greater detail with reference to the fabrication process of the BHLD illustrated in FIGS. 3A through 3D.

Figure 3A:
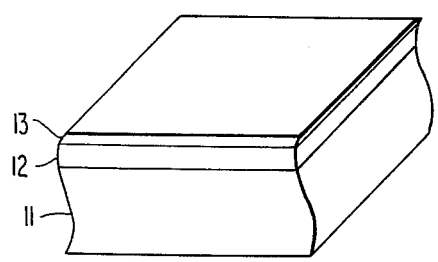
FIGS. 3A to 3D are perspective views showing successive steps in the fabrication process of the BHLD shown in FIG. 2.
Figure 3C:
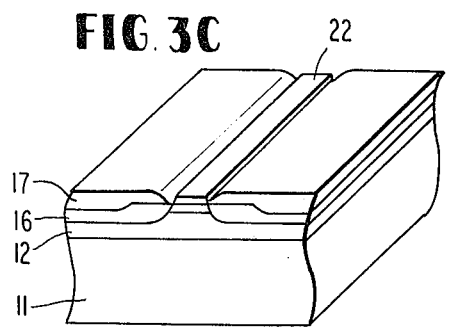
Figure 3B:
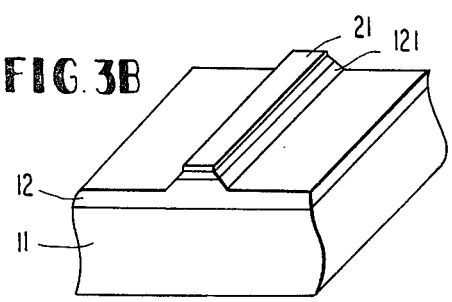

FIG. 3A shows the state that first and second semiconductor layers are successively grown on a (001)-oriented n-type InP substrate ($S_n$-doped) by the conventional liquid phase epitaxial growth process (LPE) employing a carbon slide boat. The first layer is an n-InP buffer layer ($T_e$-doped; about 3 μm in thickness) 12 and the second layer is a non-doped InGaAsP active layer (undoped; about 0.2 μm thickness) 13. The growth temperature of the active layer 13 is 635° C. and the cooling speed is 0.7° C./min. The composition of the InGaAsP active layer 13 is adjusted so as to have an emitting wavelength of 1.3 μm. In one example, the composition could be selected to be $In_{0.76} Ga_{0.24} As_{0.55} P_{0.45}$. The lattice matching between the InGaAsP active layer 3 and the InP substrate 11 is $\Delta a/a \sim 0.1\%$, where a represents the lattice constant of InP and $\Delta a$ represents the difference in lattice constant between the respective layers 3 and 11. Subsequently, after a $SiO_2$ film has been laminated on the epitaxially grown surface at a thickness of about 3000 Å, a $SiO_2$ stripe 21 of 1–2 μm in width is formed in the <110> direction through the procedure of conventional photolithography. Thereafter, mesa etching is effected up to a depth of about 1 μm by making use of a Br-methanol solution. The state after this process is illustrated in FIG. 3B.

Next, a first burying growth is effected. Upon the first embedding growth, for the purpose of avoiding thermal etching of the substrate surface, liquid-phase epitaxial growth was effected while introducing a phosphine ($PH_3$) gas into a hydrogen atmosphere by about 100 ppm to suppress thermal cracking of InP on the substrate surface. In the first burying growth, a p-InP current blocking layer 16 (zinc(Zn)-doped; about 0.5 μm in thickness at the flat portion) and an n-InP current confining layer 17 (tin(Sn)-doped; about 1.0 μm in thickness at the flat portion) are successively grown. Since the $SiO_2$ stripe 21 serves as a mask, the p-InP layer 16 and the n-InP layer 17 will not grow on the top surface of the active layer 13. The p-InP layer 16 will grow perfectly covering the side surfaces of the mesa portion 121, and the n-InP layer 17 will grow, swelling higher than the active layer 13. See FIG. 3C.

Figure 3D:
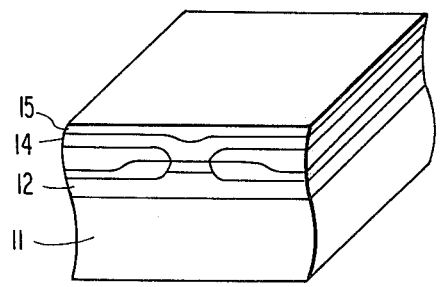

Before carrying out a second embedding growth, the $SiO_2$ stripe 21 is removed by means of a mixed buffer solution of hydrofluoric acid (HF) and ammonium fluoride ($NH_4F$). In the second embedding growth also, liquid-phase epitaxial growth is effected while introducing a $PH_3$ gas to grow a p-InP clad layer 14 (Zn-doped; about 2 μm in thickness on the active layer) and a pIn-GaAsP cap layer 15 (Zn-doped; about 0.5 μm in thickness). The composition of the InGaAsP cap layer 15 may be identical to that of the active layer 13. By the embedding growth of these two layers, the epitaxially grown surface is perfectly smoothened. The state after this process is shown in FIG. 3D. Subsequently, the conventional electrode forming treatment is carried out. As shown in FIG. 2, a p-side ohmic electrode 201, and an n-side ohmic electrode 202 are respectively alloyed by thermal treatment within a hydrogen atmosphere to form the respective electrodes.

In the above-mentioned process, the active layer stripe width is perfectly determined by the width of the stripe $SiO_2$ 21 with good reproducibility. Since the fabrication technique of high-density integrated circuits such as super LSI's has made remarkable progress, it is relatively easy to form a rectilinear stripe of about 1-2 μm in width. Therefore, in the mesa etching of the active layer in such an InGaAsP-BHLD, a good rectilinear stripe can also be obtained. Furthermore, since the p-InP blocking layer 16 has a shape which covers the side surface portions of the mesa stripe and thus can be easily epitaxially grown, it is easy to make the surface of the blocking layer 16 continue to the surface of the active layer 13.

In the case of fabricating the BHLD shown in FIG. 1, it is necessary to carry out embedding growth up to such thickness that the surfaces of the buried layer 8 and the cap layer 5 may be smoothly connected. But in the BHLD shown in FIG. 2, there is only the single cap layer 15, and so, the surface can be easily smoothened. The cap layer 15 is a layer for facilitating formation of an ohmic electrode. Since this cap layer 15 would not be held at a high temperature for a long period of time, as distinguished from the method for fabrication of the BHLD shown in FIG. 1, only a small diffusion of doped impurity Zn would occur, so that the impurity concentration can be selected high. Hence it is possible to easily form an ohmic electrode without the treatment of especially carrying out Zn-diffusion from the surface.

Figure 4:
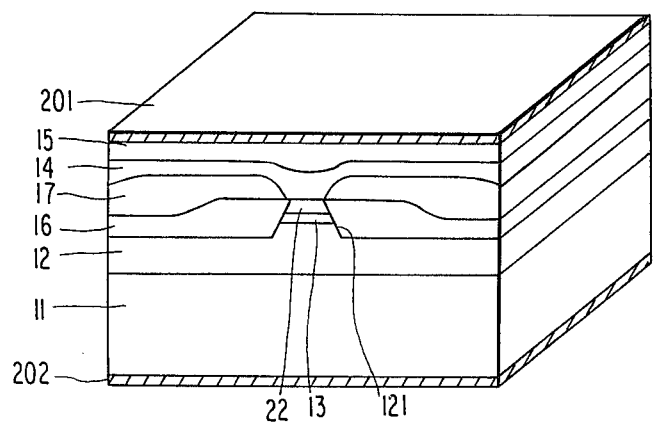
FIG. 4 is a perspective view of a BHLD according to a second preferred embodiment of the present invention.

Now a second preferred embodiment of the present invention in which the BHLD in FIG. 2 is further improved, will be described with reference to FIG. 4. The second preferred embodiment is characterized by the structure that in addition to the structure according to the first preferred embodiment an optical waveguide layer 22 is grown on the active layer 13, and the remainder is all identical to the structure of the first preferred embodiment. The optical waveguide layer 22 is an InGaAsP having a refractive index that is smaller than that of the active layer 13 but larger than that of the surrounding InP. One example of the composition of the InGaAsP semiconductor film is $In_{0.9} Ga_{0.1} As_{0.23} P_{0.77}$. By selecting the thickness of the active layer 13 as thin as about 0.05 μm and the thickness of the optical waveguide layer 22 about 0.3 μm, light can be guided along the optical waveguide layer 22 as distributed therein. Accordingly, the effective refractive index of the active layer becomes small and hence the difference in refractive index between the active layer and the surrounding InP also becomes small, so that the stripe width of the active layer for exciting a fundamental transverse mode can be made somewhat broad and thus the fabrication becomes easy. In addition, the BHLD shown in FIG. 4 has a characteristic advantage that introduction of defects can be mitigated owing to the fact that the principal surface of the active layer is not exposed to the atmosphere.

According to the above-described structures of the BHLD, there are provided characteristic advantages that the active layer stripe width can be formed into a desired width with a good reproducibility. In addition the final epitaxial plane can be easily made flat, and the impurity concentration of the p-InGaAsP cap layer can be made high. However, in either one of the above-described cases, two embedding growth processes are involved, and consequently there remains a shortcoming that the fabrication process becomes complex. In the following, a more preferable fabrication process which eliminates the above shortcoming will be described.

Figure 5:
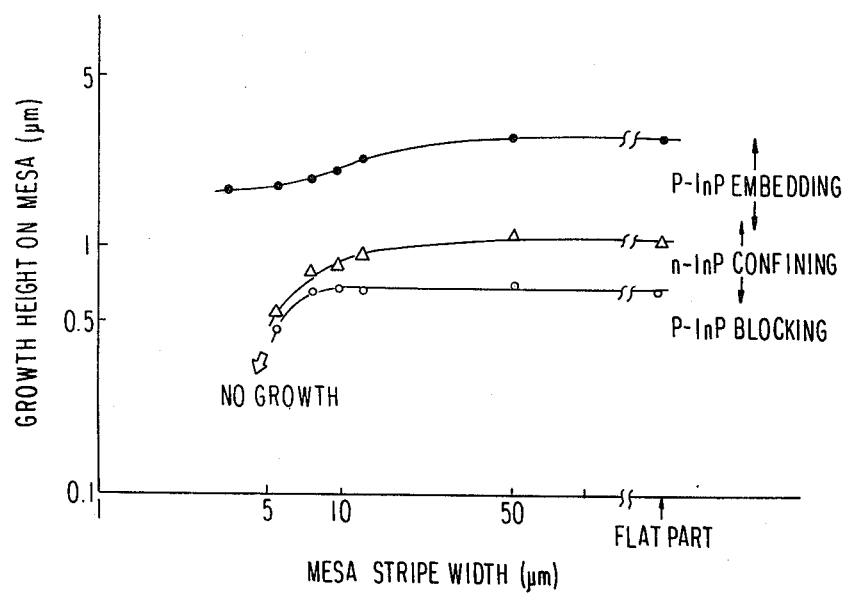
FIG. 5 is a diagram showing the relation between a mesa stripe width and a growth height on a mesa stripe, which diagram is useful for explaining a principle of a third preferred embodiment of the present invention.
Figure 6:
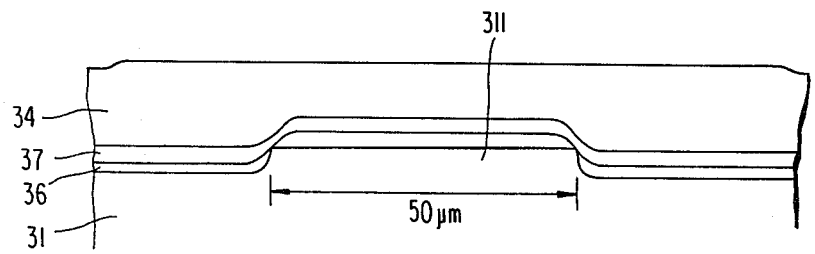
FIGS. 6 and 7 are enlarged cross-sectional views of a mesa portion in a BHLD, which is useful for explaining the states of grown layers when the mesa stripe width is varied.
Figure 7:
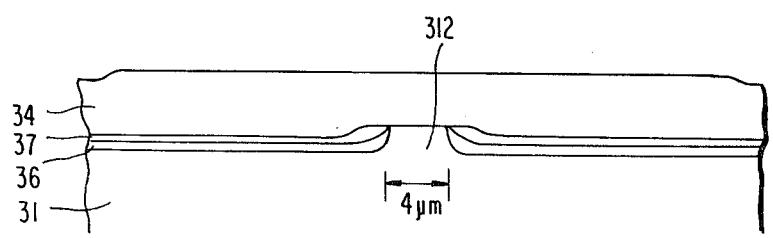

Before entering the description of preferred embodiments, description will be made of the basic inventive concept of the alternative embodiments with reference to FIGS. 5 through 8. As a preliminary experiment, several kinds of mesa stripes having a mesa height of about 2 μm and different mesa stripe widths, that is, different widths of the top surface portion of the mesa varying from 4 μm to 50 μm are formed in the <110> direction on an n-InP substrate 31 having a (001) oriented surface as its principal surface by making use of an etching liquid of a Br-ethanol system, and then growth for embedding these mesa stripes is effected. More particularly, when a p-InP current blocking layer 36 (a thickness at the flat portion being 0.5 μm), an n-InP current confining layer 37 (a thickness at a flat portion being 0.5 μm) and a p-InP embedding layer 34 (a thickness at the flat portion being 3 μm) are successively grown in the above-mentioned sequence, the thicknesses of the respective layers grown on the top surfaces of the mesa stripes would vary depending upon the mesa stripe widths as shown in FIG. 5. As shown in FIG. 6, in the case where a width of the mesa stripe 311 is as broad as about 50 μm, the thicknesses of the layers grown on the top surface of the mesa stripe are approximately equal to those of the layers grown on the flat portion. However, as the mesa stripe width is narrowed, the growth thicknesses of the first two p- and n-InP layers on the mesa top are especially reduced, and as shown in FIG. 7, in the case of a mesa stripe 312 having a width of 4 μm or less, there is no growth on the mesa top. The reason why epitaxial growth on the mesa top becomes difficult as the mesa stripe width is reduced, is presumed to be because the growing speed on the side surfaces of the mesa is high, so that phosphorus (P) contained in the indium melt contacting the mesa side surfaces is fed to the side surface portions of the mesa hence the phosphorus concentration in the peripheral portion of the mesa side surfaces is reduced, whereby the degree of super-saturation is reduced and thus growth becomes difficult. Thus, it is preferable to select the mesa width in a range of 0.1 to 4 μm, and favorably 2 to 2.5 μm.

Figure 8A:
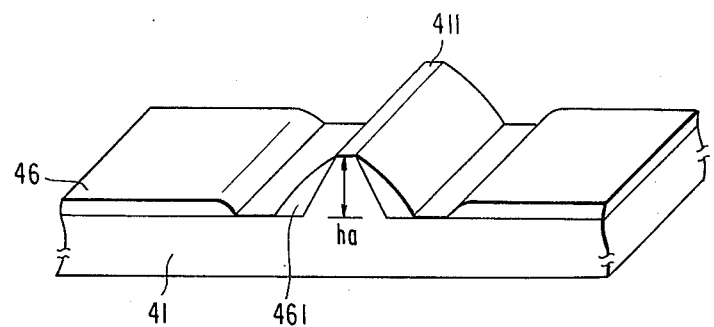
FIGS. 8A, 8B and 8C are perspective views of a mesa portion in a BHLD, which is useful for explaining the states of grown layers when the mesa stripe height is varied.
Figure 8B:
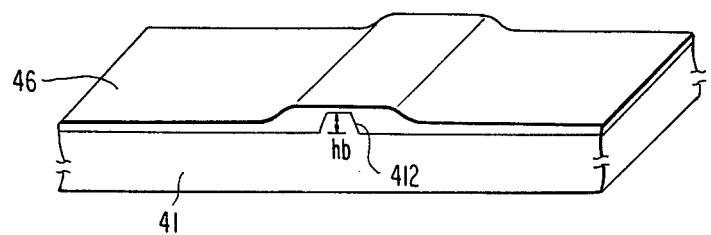
Figure 8C:
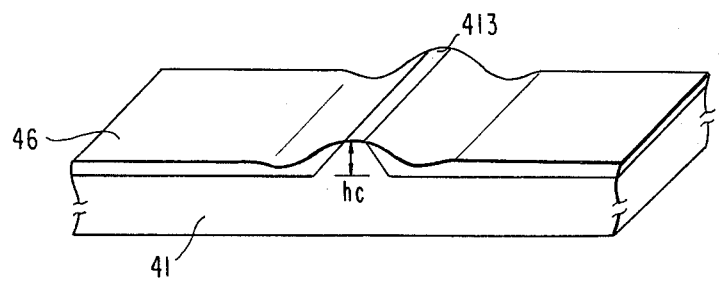
Figure 8D:
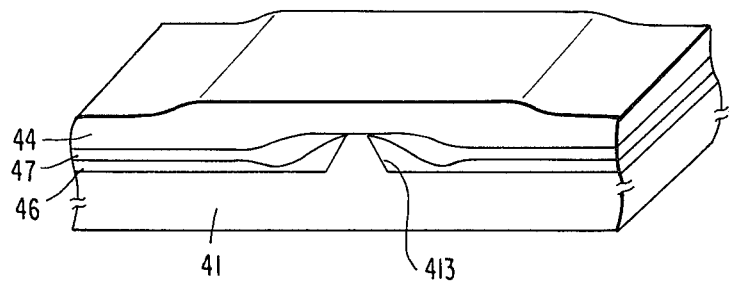
FIG. 8D is a perspective view showing one example of the structure in which three epitaxial layers have been grown on the structure illustrated in FIG. 8C.

Now, brief description will be made of the case where a mesa stripe of 2 μm in width formed on an InP substrate having a (001) oriented surface end extending in the <110> direction is embedded with an InP layer through LPE. In the LPE, the conventional carbon slide boat is used, and thermal damage of the substrate can be prevented by carrying out the growth in an atmosphere of hydrogen ($H_2$) gas containing 100 ppm phosphine ($PH_3$) gas. In every case illustrated in FIGS. 8A, 8B and 8C, the growth is effected in such manner that 4 g of indium (In) is mixed with 60 mg of InP polycrystal, the mixture is melted at 610° C. for one hour, thereafter the temperature is lowered at a cooling rate of 0.7° C. per minute, and growth is made to occur at 600° C. for two minutes. Even at the co-melting temperature of 610° C., the InP polycrystal is not perfectly dissolved in the indium solvent, and so, the condition of a so-called two phase solution is established. FIG. 8A shows the case where the height $h_a$ of a mesa 411 takes a relatively high value of 5 μm, and in this case an InP epitaxial layer 461 grows fast on the side surface portion of the mesa, but it does not grow at all on the top surface of the mesa, and an InP epitaxial layer 46 grown at the flat portion up to a thickness of about 0.7 μm and an InP epitaxial layer 461 grown on the side surface portion of the mesa are formed separately from each other. The reason for such mode of growth is presumed to be because the degree of super-saturation of the indium melt is reduced due to the reduction of phosphorus concentration in the indium melt contacting the substrate at the periphery of the mesa side surface portion as the growing speed of the InP layer on the mesa side surface portion is high, and thereby growth on the top portion becomes difficult. FIG. 8B shows the case where a height $h_b$ of a mesa 412 takes a relatively low value of 1 μm, and in this case the mesa 412 is perfectly embedded in an InP epitaxial layer 46. FIG. 8C shows the case where a height $h_c$ of a mesa 413 is selected to be 2 μm, and in this case InP epitaxial layers 46 are grown on both the mesa side surface portion and the flat portion in continuation to each other though the layer thickness becomes thin in the center position, but the epitaxial layer is not grown on the top surface of the mesa 413. Accordingly, for reproducibility, it is desirable to select the mesa height in the range of 1 to 4 μm, and more favorably 1.3 to 2 μm, but even in the range of height values slightly exceeding these upper and lower limit values, such as 0.5 to 5 μm, it is possible to make the structure shown in FIG. 8C through high-precision control.

It is to be noted that the grown state of the InP epitaxial layer in this case of FIG. 8C is a favorable configuration in the case of fabricating a current confining type InGaAsP-BHLD. If a p-InP layer 46 and an n-InP layer 47 are grown on a substrate having the same configuration as that shown in FIG. 8C, without growing them on the top surface of the mesa 413, so as to have a thickness of about 0.5 μm at the respective flat portions, and thereafter if a p-InP layer 44 is grown over the entire surface continuously at a thickness of about 3 μm, then the embedded configuration shown in FIG. 8D can be obtained. As will be described later, this embedded configuration has such structure that a current can flow only through the mesa portion.

The present invention effectively makes use of the epitaxial layer configuration formed on a substrate having a mesa stripe through the LPE as described above, which has been discovered experimentarily for the first time by the inventors of this invention.

According to the last-mentioned fabrication process, in addition to the merits of the first and second preferred embodiments described previously, the number of embedding growth processes can be made only once, and therefore, an extremely excellent BHLD can be provided.

As described above, in the event of embedding a mesa stripe having a narrow stripe width, if the orientation of the mesa stripe is chosen to be <110>, then it becomes possible to epitaxially grow an InP layer only on the peripheral portion and side surface portion of the mesa stripe without epitaxially growing it on the top surface of the mesa stripe, with good reproducibility. In a third preferred embodiment of the present invention as will be described in more detail in the following, by making use of such an epitaxial growth technique, it has become possible to complete the fabrication with only one embedding growth process, without carrying out embedding growths twice as is the case with the above-described first and second preferred embodiments.

Figure 9A:
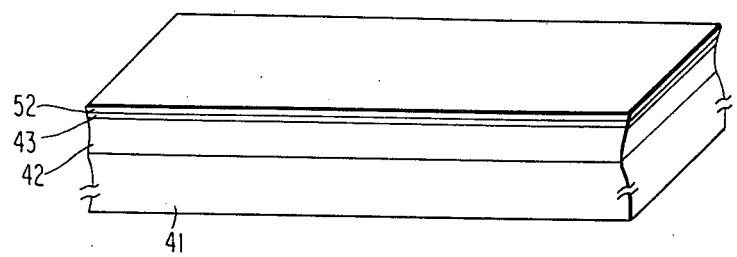
FIGS. 9A, 9B and 9C are perspective views showing successive steps in the fabrication process of a BHLD according to a third preferred embodiment of the present invention.
Figure 9B:
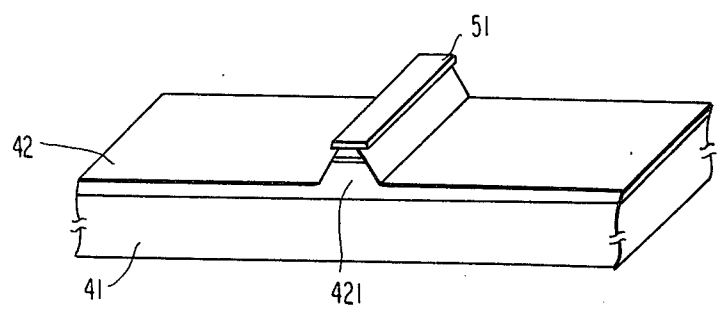
Figure 9C:
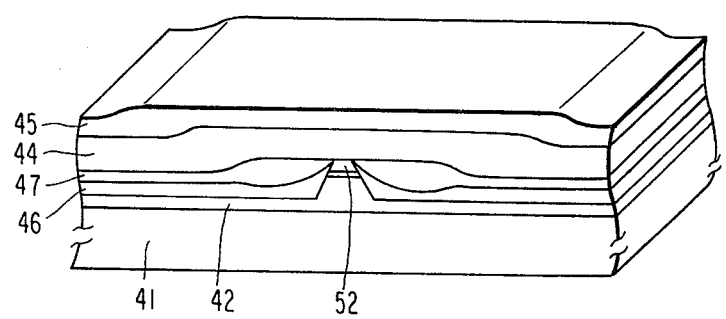

A third preferred embodiment of the present invention is illustrated in FIGS. 9A to 9C and FIG. 10. FIG. 9A shows the state where an n-InP buffer layer 42 (Sn-doped; 5 μm in thickness), non-dope InGaAsP active layer 43 (composition corresponding to a lasing wavelength of 1.3 μm; 0.2 μm in thickness) and p-InP clad layer 52 (Zn-doped; 0.5 μm in thickness) are successively grown on an n-InP substrate 41 (Sn-doped; (001) oriented surface). The growing temperature of the active layer is 635° C., and in order to realize lattice matching between the active layer and InP, 4 g of indium are added to 51 mg of GaAs polycrystal, 290 mg of InAs polycrystal and 40 mg of InP polycrystal. The lattice matching Δ a/a between the InGaAsP active layer 43 and the n-InP layer 42 and p-InP layer 52 is kept within 0.05%. Subsequently, as shown in FIG. 9B, after a stripe 51 of photo-resist of 2-3 μm in width has been formed on the clad layer 52 along the <110> direction through the conventional photo-lithographic procedure, etching process is effected up to a depth of about 2 μm by means of a Br-methanol solution by employing the photo-resist stripe 51 as a mask, and thereby a mesa stripe 421 is formed. Next, embedding growth as shown in FIG. 9C is effected. This embedding growth is carried out under the same growing condition as that in the case shown in FIG. 8D. More particularly, a p-InP current blocking layer 46 (Zn-doped; 0.5 μm in thickness at the flat portion) and an n-InP current confining layer 47 (Sn-doped; 0.5 μm in thickness at the flat portion) are successively stacked continuously except for the portion above the top surface of the mesa stripe 421 where the InP layers are not grown, thereafter p-InP embedding layer 44 (Zn-doped; 3 μm in thickness at the flat portion) is stacked continuously over the entire surface, and finally an n-InGaAsP cap layer 45 (Te-doped; 0.5 μm in thickness) to end the growth. Upon the embedding growth, since the p-InP current blocking layer 46 tends to grow on the side surfaces and thus the current blocking layer 46 and the p-InP clad layer 52 in the mesa stripe 421 continue to each other, the n-InP current confining layer 47 and the n-InP buffer layer 42 would be perfectly isolated. As noted previously, this is a favorable configuration for improving the characteristic temperature of the InGaAsP-BHLD.

Figure 10:
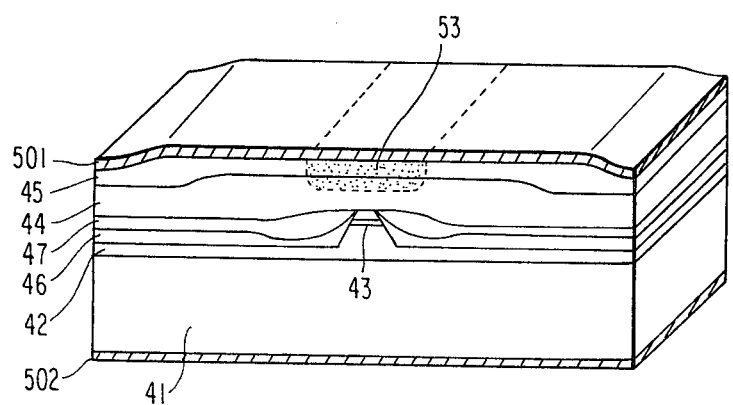
FIG. 10 is a completed perspective view of a BHLD obtained through the fabrication steps illustrated in FIGS. 9A, 9B and 9C.

FIG. 10 is a perspective view of an InGaAsP-BHLD fabricated through the steps of forming a selective Zn-diffused layer 53 of 10 μm in width up to a depth reaching the p-InP embedding layer 44 through the conventional method on a multi-layer wafer obtained through the fabrication process illustrated in FIGS. 9A to 9C. Thereafter an Au-Zn ohmic electrode 501 is formed on the p-side and an An-Ge-Ni electrode 502 is formed on the n-side, and then the multi-layer wafer is cleaned so that a (110) oriented surfaces may become a Fabry-Perot resonator. When a bias voltage is applied to this InGaAsP-BHLD with the p-side held positive and with the n-side held negative, radiative recombination occurs in the InGaAsP active layer 43 within the mesa stripe 421. At the other regions, however, negative-resistance characteristics are presented because of the existence of the pnpn-junctions, and hence at an applied voltage lower than a breakdown voltage on the crystal end surface (6-7 V), a current would scarcely flow. Accordingly, current flow would be concentrated through the active layer 43 and the clad layer 32, and hence a low lasing current threshold value of the order of 20 mA can be obtained. In addition, although the p-InP clad layer 52 within the mesa stripe 421 and the p-InP current blocking layer 46 are contiguous to each other, by selecting the carrier concentration of the p-InP current blocking layer 46 lower (for instance $5 \times 10^{17}/cm^3$) than that of the p-InP. clad layer 46 (for instance, $8 \times 10^{17}/cm^3$), the p-InP current blocking layer 46 can function as a resistance layer. Thereby, increase of leakage current through a pn-junction of InP in the periphery of the mesa stripe 421 which increase is caused by temperature rise, can be suppressed. Accordingly, the characteristic temperature of the InGaAsP-BHLD having such structure has been greatly improved to about 70 K. at a device temperature not higher than 100° C. as compared to the characteristic temperature of about 40 K. in the case where the p-InP current blocking layer 46 is not provided. Moreover, since the p-InP current blocking layer 46 is apt to grow quickly along the side surface of the mesa stripe 421 as a nature of crystal growth, it continues certainly to the p-InP clad layer 52 within the mesa stripe, and therefore, in the fabrication of the InGaAsP-BHLD's, reproducibility of formation of the current blocking layer 46 has been greatly improved, resulting in great enhancement of the yield of fabrication of the devices.

While InGaAsP having a composition corresponding to a lasing wavelength of 1.3 μm was used as an active layer 43 in the above-described embodiments of the present invention, the invention should not be limited to such composition nor such lasing wavelength, but any arbitrary wavelength falling in the lasing wavelength range of 1.1 μm to 1.7 μm of an InGaAsP mixed crystal could be chosen. In addition, while p-type and n-type InP layers were used respectively for the current blocking layer 46 and for the current confining layer 47, it is only necessary for these layers to achieve the function of concentrating a current in the active layer 43 and clad layer 52, and hence they could be semi-insulating InP layers. Also, while the p-InP clad layer 52, is grown during the first growth, this layer could be omitted.

Figure 11:
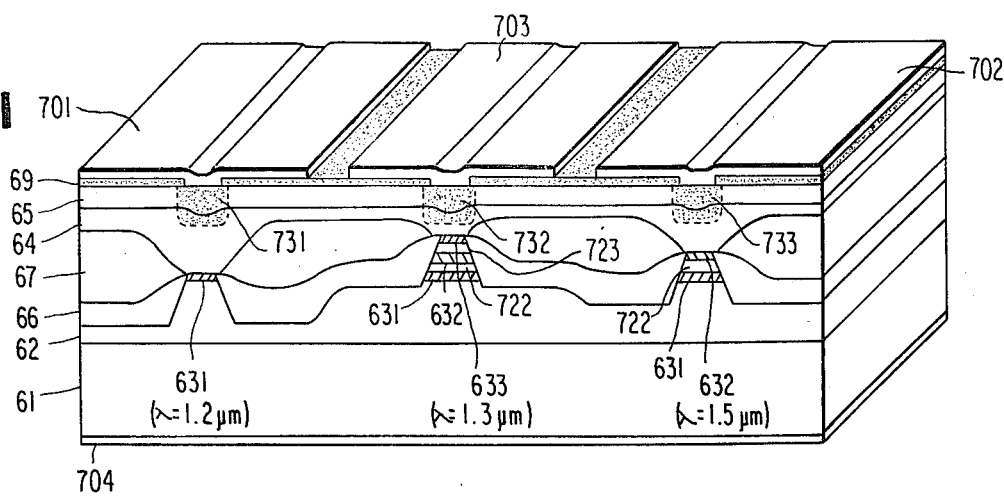
FIG. 11 is a perspective view of a BHLD according to a fourth preferred embodiment of the present invention.

In a fourth preferred embodiment of the present invention, three BHLD's having different lasing wavelengths from each other are formed on the same substrate as shown in FIG. 11. In this schematic drawing, the portion under an electrode 701 on the left side as seen from the front of the drawing is a BHLD having a lasing wavelength of 1.2 μm, in which a pn-junction contributing to radiative recombination is formed at the top of an InGaAsP layer 631 corresponding to a lasing wavelength $\lambda = 1.2$ μm (for instance, $In_{0.82}Ga_{0.18}As_{0.4}P_{0.6}$). Likewise, the portion under a right side electrode 702 is a BHLD having a lasing wavelength of 1.5 μm, the portion under a central electrode 703 is a BHLD having a lasing wavelength of 1.3 μm, and pn-junctions contributing to luminescent recombination are formed respectively at the top of an InGaAsP layer 632 corresponding to a lasing wavelength $\lambda = 1.5$ μm (for instance, $In_{0.65}Ga_{0.35}As_{0.78}P_{0.22}$) and at the top of an InGaAsP layer 633 corresponding to a lasing wavelength $\lambda = 1.3$ μm (for instance, $In_{0.76}G_{0.24}As_{0.55}P_{0.45}$).

Figure 12:
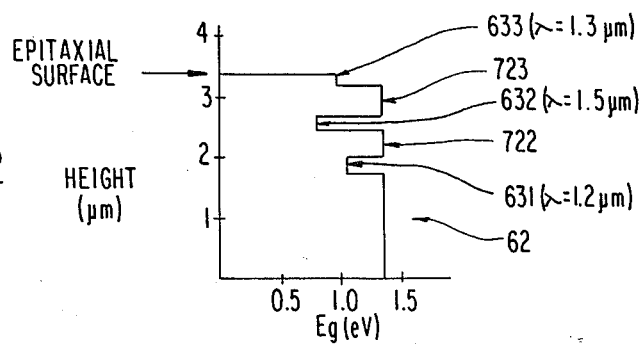
FIG. 12 is a characteristic diagram showing a relation between a band gap of each layer in the BHLD shown in FIG. 11 and a growth height thereof.

Now the operation of the multi-wavelength integrated InGaAsP-BHLD shown in FIG. 11 will be explained briefly with reference to FIG. 12 which shows the relation between band gaps (Eg) and heights H from the substrate surface of the three independent active layers 631, 632 and 633. For instance, in the case of operating the left side BHLD having a lasing wavelength of 1.3 μm, when a forward bias voltage (positive voltage) is applied to the p-side ohmic electrode 701, a current penetrates through an n-InGaAsP cap layer 65, then passes through a stripe-shaped Zn-diffused region 731, and flows through a p-InP clad layer 64. However, since the boundary between an n-InP current confining layer 67 and a p-InP current blocking layer 66 is an np-junction in a backwardly biased condition, the current is injected only into the InGaAsP active layer 631 whose top boundary is a pn-junction in a forwardly biased condition. When a current is injected exceeding a threshold current, then lasing would occur in the active layer 631. In the central BHLD having a lasing wavelength of 1.3 μm and in the right side BHLD having a lasing wavelength of 1.5 μm also, the operation is exactly the same as the above-described one. Since the p-side electrodes 701, 702 and 703 of the respective BHLD's are isolated, it is possible to independently inject currents to the respective BHLD's. In this way, the three BHLD's formed on the same substrate and having lasing wavelengths of 1.2 μm, 1.3 μm and 1.5 μm, respectively, can be operated independently by injecting currents from the respective p-side ohmic electrodes 701, 702 and 703. The composition of the cap layer may be identical to that of the active layer 633 ($\lambda = 1.3$).

Now, in connection with the multi-wavelength integrated InGaAsP-BHLD illustrated in FIG. 11, a process for fabricating the BHLD which is basically similar to the fabrication process described in connection to the first preferred embodiment (FIGS. 3A to 3D) will be described in detail with reference to FIGS. 13A to 13F.

Figure 13A:
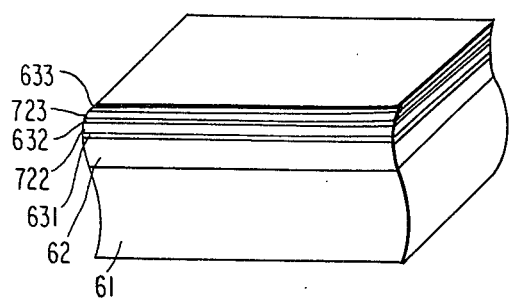
FIGS. 13A through 13F are perspective views showing successive steps in the fabrication process of the BHLD shown in FIG. 11.

At first, as shown in FIG. 13A, an n-InP buffer layer 62 (Te-doped; about 3 μm in thickness), an InGaAsP layer 631 (undoped; about 0.2 μm in thickness), an n-InP layer 722 (Te-doped; about 0.5 μm in thickness), an InGaAsP layer 632 (undoped; about 0.2 μm in thickness), an n-InP layer 723 (Te-doped; about 0.5 μm in thickness) and an InGaAsP layer 633 (undoped; about 0.2 μm in thickness) are successively grown on an n-InP substrate 61 (Si-doped; (001) surface) by LEP. The growing temperature is 630° C., and the cooling speed is 0.7° C./min. The lattice matching between the respective InGaAsP layers and the InP substrate is Δ a/a≲0.1%.

Figure 13D:
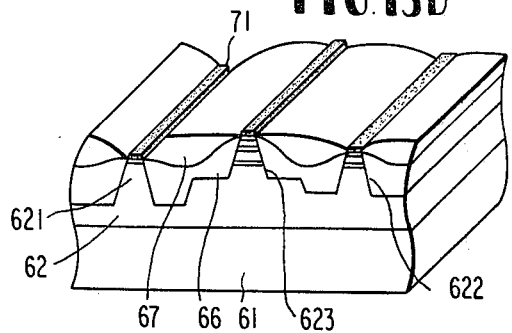
Figure 13B:
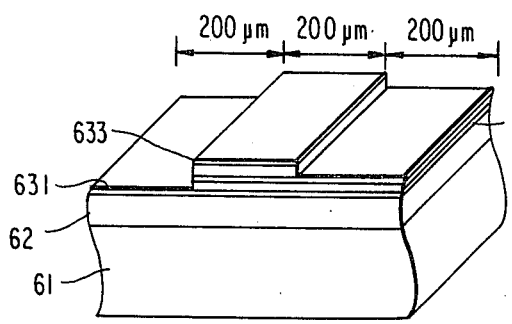

Subsequently, the epitaxial surface are etched using photo-resist masks so that the InGaAsP layer 631, InGaAsP layer 633 and InGaAsP layer 622 may be exposed on the top surface, forming respective regions of ®μm in length, and thereby a stepped semiconductor stack is formed. This state is illustrated in FIG. 13B. It is to be noted that the etching could be stopped a little short of the upper surfaces of the respective active layers 631, 632 and 633 without etching until the respective upper surfaces are exposed.

Figure 13E:
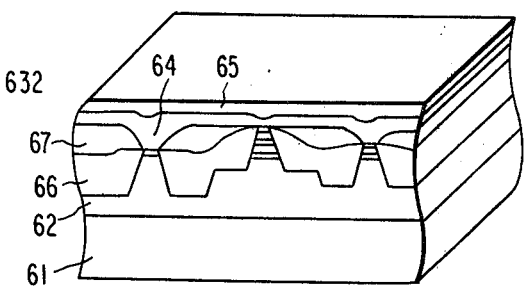
Figure 13C:
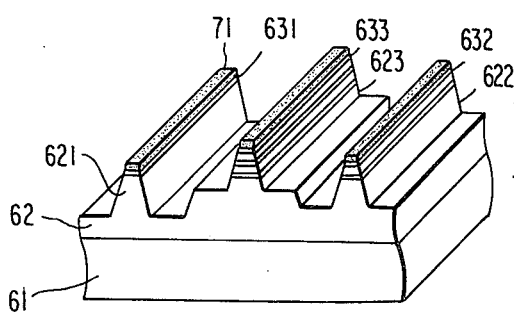

Next, a SiO$_2$ film is deposited on the surface in a thickness of about 3000 Å through a chemical vapor deposition (CVD) process, thereafter SiO$_2$ stripes 71 of 1-2 μm in width are formed in the <110> direction through the conventional photo-lithographic procedure, and mesa etching is effected up to a depth of about 2 μm by means of a Br-methanol solution so as to leave stripe-shaped mesa structures 621, 622 and 623 as shown in FIG. 13C.

Now a first embedding growth for the substrate under the condition illustrated in FIG. 13C is effected. Upon embedding growth, in order to avoid thermal etching of the substrate surface, liquid phase epitaxial growth is effected at about 610° C., while suppressing thermal cracking of InP on the substrate surface by introducing a PH$_3$ gas into a H$_2$ atmosphere at a concentration of about 100 ppm. In this first embedding growth, as shown in FIG. 13D, a p-InP current blocking layer 66 (Zn-doped; about 2 μm in thickness at the flat portion) and an n-InP current confining layer 67 (Sn-doped; about 0.5 μm in thickness at the flat portion) are epitaxially grown in the form of perfectly covering the side surfaces of the stripe-shaped mesa structures 621, 622 and 623. During this period, epitaxial growth would not occur on the top surfaces of the stripe-shaped mesa structures 621, 622 and 623 because these top surfaces are covered by SiO$_2$ films 72.

After the SiO$_2$ films 71 are etched by a mixed buffer solution of HF and NH$_4$F to expose the top surfaces, second embedding growth is effected. In this second embedding growth, a PH$_3$ gas is also introduced and the growing temperature is 635° C. After a p-InP clad layer 64 (Zn-doped; about 0.5 μm in thickness at flat portion) has been grown first, an n-InGaAsP cap layer 65 (Sn-doped; about 'μm in thickness at flat portion) is grown thereon. These respective layers 64 and 65 are grown in the form adapted for smoothening the unevenness of the lower portion, and after completion of the embedding growth the surface becomes substantially flat. This state is illustrated in FIG. 13E.

Figure 13F:
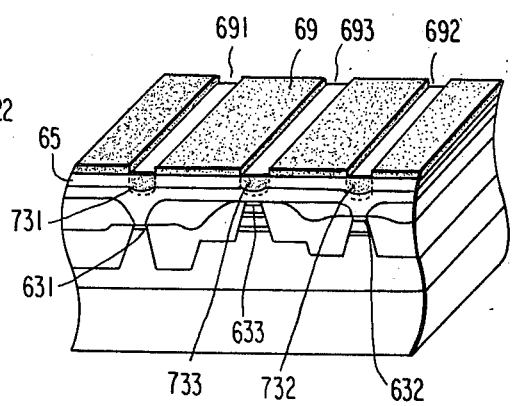

Subsequently, again a SiO$_2$ film is deposited through a CVD process, then stripe-shaped windows for selective Zn-diffusion 691, 692 and 693 of 10 μm in width are opened in the SiO$_2$ film as aligned with and positioned above the active stripes 621, 622 and 623, respectively, to form SiO$_2$ layers 69 isolated by the stripe-shaped exposed sections as shown in FIG. 13F. Under said condition the substrate is sealingly enclosed within a quartz ample of 10 mm in diameter and about 10 cm in diameter together with 15 mg for each of ZnP$_2$ and ZnAs$_2$, thus diffusion treatment is effected at 640° C. for 2 minutes so that a diffusion front may pass through the n-InGaAsP electrode forming layer 65 and may reach the P-InP clad layer 64, and thereby p-type diffused regions 731, 732 and 733 can be formed.

Thereafter, under the conventional electrode forming condition, p-side ohmic electrodes 701, 702 and 703 (FIG. 11) which are isolated from each other are formed of Au-Zn, while a single n-side ohmic electrode 702 (FIG. 11) is formed of Au-Ge-Sn. Through the above-described fabrication process, a multi-wavelength integrated InGaAsP-BHLD as shown in FIG. 11 can be obtained.

While the current blocking layer and the current confining layer were formed by making use of SiO$_2$ mask in the above-described fourth embodiment, as a matter of course, the fabrication process described previously in connection with the third preferred embodiment of the present invention could be equally employed. Furthermore, the sequence of positioning of the three kinds of active layers is not limited to the arrangement shown in FIG. 11.

Figure 14:
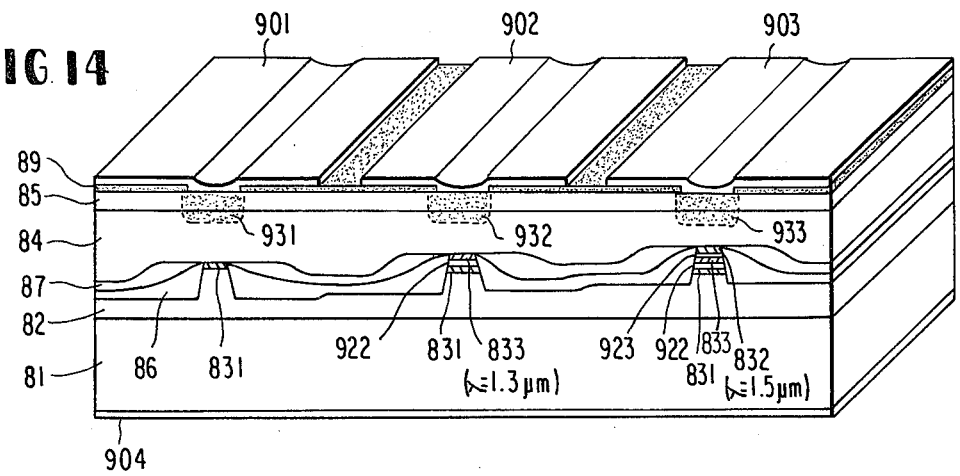
FIG. 14 is a perspective view showing a BHLD according to a fifth preferred embodiment of the present invention.

For instance, in a fifth preferred embodiment of the present invention illustrated in FIG. 14, InGaAsP active layers 831, 832 and 833 (all undoped; about 0.2 μm in thickness for every layer) corresponding to lasing wavelengths of 1.2 μm, 1.3 μm and 1.5 μm, respectively, are grown in the sequence of successively reducing band gaps with n-InP layers 922 and 923 (Te-doped; about 0.1 μm in thickness) interposed therebetween.

This fifth preferred embodiment corresponds to the case where the fabrication process explained previously in connection with the third preferred embodiment of the present invention (FIGS. 9A to 9C) is employed.

Figure 15:
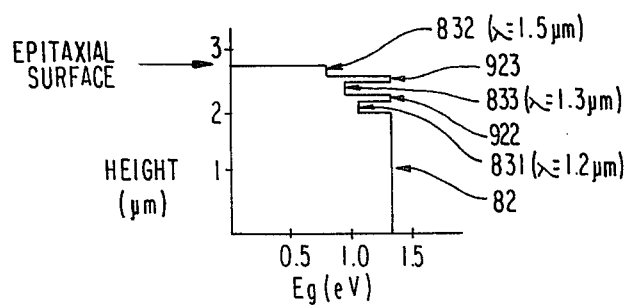
FIG. 15 is a characteristic diagram showing a relation between a band gap of each layer in the BHLD shown in FIG. 14 and a growth height thereof.

FIG. 15 is a diagram showing the relation between the heights from the substrate surface and the band gaps (Eg) in this device. When a growth order of the InGaAsP layers having lasing wavelengths of 1.2 μm, 1.3 μm and 1.5 μm are at random like the fourth preferred embodiment, the thickness of the interposed n-InP layer must be selected as thick as about 0.5 μm or layer for the purpose of achieving effective confinement of carriers and light. However, when three active layers are grown in the specific sequence such that the uppermost active layer has the smallest band gap and the lowermost active layer has the largest band gap, the thickness of the interposed n-InP layers 922 and 923 can be reduced to as thin as about 0.1 μm. Accordingly the depth of mesa etching can be made as shallow as about 1 μm, and thus the mesa etching end embedding growth can be facilitated. In the fifth embodiment, with respect to the BHLD's having lasing wavelengths of 1.3 μm and 1.5 μm, respectively, there is provided a structure in which at least one InGaAsP layer having a larger band gap is present under the active layer, and this structure forms the so-called separate confinement heterostructure type in which carriers are perfectly confined within an active layer, and light is confined by a combination of an active layer and an InGaAsP layer located under the active layer. Since the band gap of the InGaAsP layer under the active layer is larger than that of the active layer, absorption loss is small, and if the thickness of the active layer is selected to be about 0.2 μm, then penetration of light from the active layer is small, and degradation of the laser performance, such as increase of the lasing threshold value of a BHLD, will not occur. It is to be noted that as a matter of course, the operation of the device according to the fifth preferred embodiment of the invention is exactly the same as that of the device according to the fourth preferred embodiment.

The BHLD structures according to the fourth and fifth preferred embodiments can be fabricated far more easily as compared to the case where a similar multi-wavelength integrated InGaAsP-BHLD is fabricated on the basis of the BHLD structure in the prior art as illustrated in FIG. 1. More particularly, according to the present invention, a multi-wavelength integrated BHLD can be easily fabricated by adding a multi-step etching process to a process for fabricating a single-wavelength BHLD, whereas in the case of employing the heretofore known structure as shown in FIG. 1, it is necessary to fabricate a structure in which regions having different active layer compositions are disposed in juxtaposition, hence generally a plurality of repeated growth processes are necessitated, and thus the fabrication process would involve more steps than the process according to the present invention.

According to the present invention, besides the preferred embodiments described above and illustrated in the accompanying drawings, many other modifications thereof could be made. At first, with regard to the semiconductor materials, they are not limited to materials in the InGaAsP system but other materials such as materials of an AlGaAs system and AlGaAsSb system could be employed, and the conductivity types could be reversed. Furthermore, the p-InP current blocking layer could be a p-InGaAsP layer having a larger forbidden band width than the active layer. On the other hand, while three BHLD's having three different lasing wavelengths are integrated on the same substrate in the above-described fourth and fifth preferred embodiments, it is also possible to integrate more kinds of BHLD's having different lasing wavelengths or BHLD's having two kinds of lasing wavelengths on one substrate. In addition, while a $SiO_2$ film deposited through a CVD process was used to prevent epitaxial growth on the top of the stripe-shaped mesa structure in the first embedding growth, an oxide film of InGaAsP formed by anodic oxidation or thermal oxidation of an InGaAsP film could be used in place of the $SiO_2$ film.

Finally, enumerating the characteristic advantages provided by the present invention, they are that an active layer stripe can be easily fabricated, that a current blocking layer can be easily grown along the side surfaces of the active layer with good reproducibility, that the final grown surface is flat, and that an impurity concentration in a cap layer can be made high and hence formation of ohmic electrodes is easy. Moreover, according to the third and fourth preferred embodiments of the invention, only one embedding growth process is necessary, and accordingly, the fabrication process is further simplified.

What is claimed is:

1. A buried heterostructure laser diode comprising a semiconductor crystal having a pair of principal surfaces and a pair of reflective end surfaces constituting an optical resonator, and a pair of electrodes, said semiconductor crystal including a base semiconductor region having a mesa portion and having a first conductivity type, said mesa portion being elongated and extending between said pair of reflective end surfaces and substantially parallel thereto in a stripe geometry, said semiconductor crystal further including a first semiconductor layer provided only on a top surface of said mesa portion and having a band gap smaller than that of said base semiconductor region and extending between said pair of reflective end surfaces in a stripe geometry, a pair of second semiconductor layers provided on said base region and covering side surfaces of said first layer and side surfaces of said mesa portion and having a second conductivity type and a band gap larger than that of said first layer, a pair of third semiconductor layers provided only on the top surfaces of said second layers and having said first conductivity type and a band gap larger than that of said first layer, and a fourth semiconductor layer commonly provided on the top surfaces of said first layer and said third layers and having said second conductivity type and a band gap larger than that of said first layer, said electrodes being provided on said principal surfaces.

2. A buried heterostructure laser diode as claimed in claim 1, in which said first layer includes a plurality of semiconductor layers having different band gaps.

3. A buried heterostructure laser diode as claimed in claim 1, in which said first layer has a width in a range of 2~2.5 μm and the combined height of the mesa portion and said first layer is in the range of 1.3–2 μm.

4. A buried heterostructure laser diode as claimed in claim 2 wherein said plurality of semiconductor layers comprises an active layer and a waveguide layer.

5. A buried heterostructure laser diode as claimed in claim 1 wherein said first semiconductor layer is an active layer, said second semiconductor layers are current-blocking layers, and said third semiconductor layers are current-confining layers.

6. A buried heterostructure laser diode as claimed in claim 1 wherein said first semiconductor layer comprises InGaAsP.

7. A multi-wavelength integrated buried heterostructure laser diode device comprising a plurality of laser diodes, said laser diodes being isolated from each other and lasing at different wavelengths, each laser diode comprising a semiconductor crystal having a pair of principal surfaces and a pair of reflective end surfaces constituting an optical resonator, and a pair of electrodes, said semiconductor crystal including a base semiconductor region having a mesa portion and having a first conductivity type, said mesa portion being elongated and extending between said pair of reflective end surfaces and substantially parallel thereto in a stripe geometry, said semiconductor crystal further including a first semiconductor layer provided only on a top surface of said mesa portion and having a band gap smaller than that of said base semiconductor region and extending between said pair of reflective end surfaces in a stripe geometry, a pair of second semiconductor layers provided on said base region and covering side surfaces of said first layer and side surfaces of said mesa portion and having a second conductivity type and a band gap larger than that of said first layer, a pair of third semiconductor layers provided only on the top surfaces of said second layers and having said first conductivity type and a band gap larger than that of said first layer, and a fourth semiconductor layer commonly provided on the top surfaces of said first layer and said third layers and having said second conductivity type and a band tap larger than that of said first layer, said electrodes being provided on said principal surfaces.

* * * * *

UNITED STATES PATENT AND TRADEMARK OFFICE
CERTIFICATE OF CORRECTION

PATENT NO. : 4,425,650

DATED : January 10, 1984

INVENTOR(S) : Mito et al

It is certified that error appears in the above-identified patent and that said Letters Patent is hereby corrected as shown below:

```
Column 1, line 23, after "a", change "single" to --signal--;

line 26, before "such", insert a --,--;

line 29, after "practical", insert a --,--;

line 31, after "characteristics", insert a --,--;

line 38, after "characteristics", insert a --,--;

line 39, after "system", insert a --,--;

line 54, after "characteristics", insert a --,--;

line 56, change "80°C" to --50°C--;

line 63, change "112µm" to --1-2 µm--.

Column 4, line 11, after "of", delete "the";

line 37, after "6", change "continues" to
                  --continue--.

Column 5, line 2, after "13", insert a --,--;

line 6, before "of", change "surface" to
                  --surfaces--;

line 54, after "grow", insert a --,--.
```

UNITED STATES PATENT AND TRADEMARK OFFICE
CERTIFICATE OF CORRECTION

PATENT NO.   : 4,425,650
DATED        : January 10, 1984
INVENTOR(S)  : Mito et al It is certified that error appears in the above-identified patent and that said Letters Patent is hereby corrected as shown below:

```
Column  7, line 23, after "at", change "a" to --the--;

line 44, after "mesa", insert a --;--.

Column  8, line 23, after "other", insert a --,--.

Column  9, line 23, after "procedure", insert --an--.

Column 10, line  8, after "p-InP", delete the ".";

line 12, after "421", insert a --,--.

Column 11, line 47, before "are", change "surface" to
                    --surfaces--;

line 51, before "in", change "R µm" to
                    --200 µm--;

line 55, after "633", insert a --,--.
```

UNITED STATES PATENT AND TRADEMARK OFFICE
CERTIFICATE OF CORRECTION

PATENT NO. : 4,425,650

Page 3 of 3

DATED : January 10, 1984

INVENTOR(S) : Mito et al

It is certified that error appears in the above-identified patent and that said Letters Patent is hereby corrected as shown below:

Column 12, line 23, change "'µm" to --1µm--.

Column 13, line 32, after "and", insert a --,--.

Signed and Sealed this

Second Day of July 1985

[SEAL]

Attest:

DONALD J. QUIGG

*Attesting Officer*  *Acting Commissioner of Patents and Trademarks*